US011355938B2

(12) United States Patent
Lu et al.

(10) Patent No.: US 11,355,938 B2
(45) Date of Patent: Jun. 7, 2022

(54) CHARGING LOAD DETECTION CIRCUIT

(71) Applicant: DELTA ELECTRONICS, INC., Taoyuan (TW)

(72) Inventors: Ting-Yun Lu, Taoyuan (TW); Shih-Chung Wang, Taoyuan (TW); Ying-Chieh Wang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 452 days.

(21) Appl. No.: 16/536,832

(22) Filed: Aug. 9, 2019

(65) Prior Publication Data

US 2020/0400753 A1     Dec. 24, 2020

(30) Foreign Application Priority Data

Jun. 21, 2019 (CN) .......................... 201910542082.5

(51) Int. Cl.
    *H02J 7/00*     (2006.01)
(52) U.S. Cl.
    CPC ............ *H02J 7/00038* (2020.01); *H02J 7/00* (2013.01)

(58) Field of Classification Search
    None
    See application file for complete search history.

(56) References Cited

U.S. PATENT DOCUMENTS

| 9,853,481 B2 * | 12/2017 | Lee ......................... H02J 50/10 |
| 10,847,979 B2 * | 11/2020 | Long ......................... H02M 3/07 |
| 2015/0233990 A1 | 8/2015 | Lee et al. |

FOREIGN PATENT DOCUMENTS

CN    106030966 A    10/2016

\* cited by examiner

*Primary Examiner* — Leigh M Garbowski
(74) *Attorney, Agent, or Firm* — Muncy, Geissler, Olds & Lowe, P.C.

(57) ABSTRACT

A charging load detection circuit includes a charging circuit, a frequency generation unit, and a control unit. The control unit controls the frequency generation unit to generate a pulse voltage with a fixed first frequency and a fixed first amplitude, and the frequency generation unit provides the pulse voltage to an output terminal of the charging circuit. The control unit detects whether a load is coupled to the output terminal by detecting whether the first frequency and the first amplitude are varied, and controls connecting or disconnecting a charging path of the charging circuit according to whether the load is coupled to the output terminal.

14 Claims, 9 Drawing Sheets

US 11,355,938 B2

CHARGING LOAD DETECTION CIRCUIT

BACKGROUND

Technical Field

The present disclosure relates to a charging load detection circuit, and more particularly to a charging load detection circuit of detecting loading types and loading conditions by a low-current pulse voltage.

Description of Related Art

The statements in this section merely provide background information related to the present disclosure and do not necessarily constitute prior art.

In today's society, more and more batteries inside the electronic products are used to maintain the power required for the operation of electronic products. Therefore, when the battery is out of power, the battery must be charged by using the charging technology of the charger. However, since the wide-range applications of batteries, and the types of battery management systems used in various fields are different, the charger must be able to recognize the state of the battery and provide the correct charging mode, and also be able to correspond to other connected devices, such as charging stations or other power supply requirements.

In the current charger industry, the charger used in the battery needs to use an internal controller to provide more than one pin to detect and display whether the battery is coupled to the charger and the type of battery. Under the no-load condition of the charger, the controller must continuously consume energy to detect the battery, which causes the power consumption losses of the charger increasing, thus failing to meet the low-power consumption of the new US/European energy regulations or customer specifications.

Therefore, how to design a charging load detection circuit to detect and display whether the battery is coupled to the charger and the type of battery so that the controller inside the charger does not need to provide additional pins for battery detection.

SUMMARY

In order to solve the mentioned-above problems, the present disclosure provides a charging load detection circuit. The charging load detection circuit includes a charging circuit, a frequency generation unit, and a control unit. The charging circuit provides a charging path having an input terminal and an output terminal, and the input terminal coupled to a charger. The frequency generation unit is coupled to the output terminal through the charging path. The control unit is couple to the charging circuit and the frequency generation unit. The control unit controls the frequency generation unit to generate a pulse voltage with a fixed first frequency and a fixed first amplitude, and the frequency generation unit provides the pulse voltage to the output terminal. The control unit realizes whether a load is coupled to the output terminal by detecting whether the first frequency and the first amplitude are varied, and controls connecting or disconnecting the charging path according to whether the load is coupled to the output terminal.

It is to be understood that both the foregoing general description and the following detailed description are exemplary, and are intended to provide further explanation of the present disclosure as claimed. Other advantages and features of the present disclosure will be apparent from the following description, drawings and claims.

BRIEF DESCRIPTION OF DRAWING

The present disclosure can be more fully understood by reading the following detailed description of the embodiment, with reference made to the accompanying drawings as follows.

DETAILED DESCRIPTION

Figure 1:
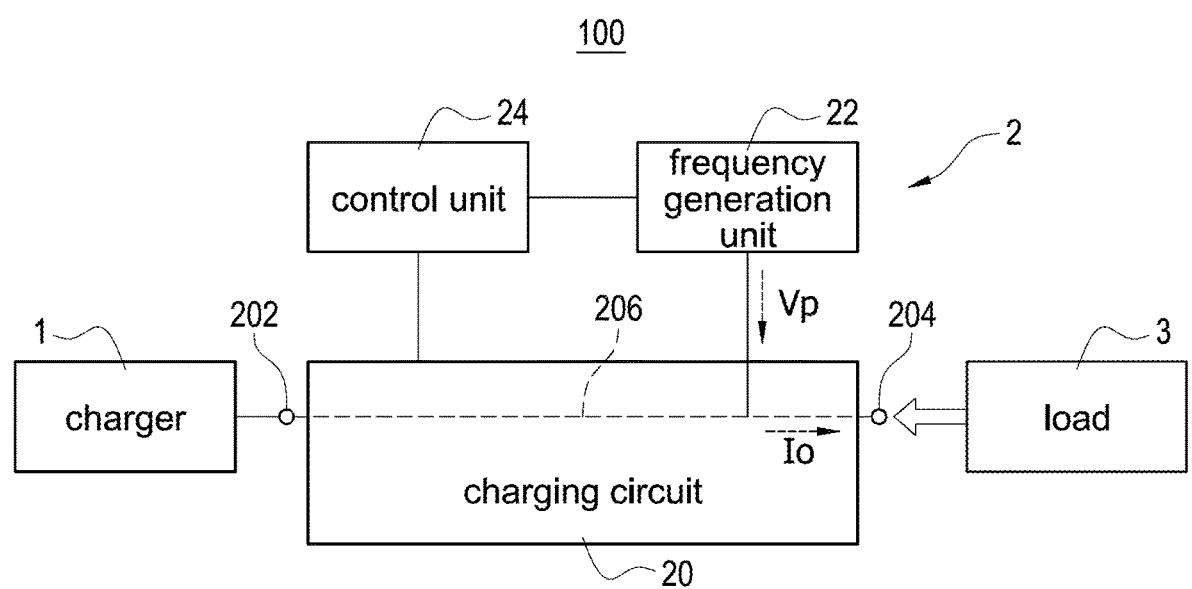
FIG. 1 is a block diagram of a charging load detection system according to the present disclosure.

Reference will now be made to the drawing figures to describe the present disclosure in detail. It will be understood that the drawing figures and exemplified embodiments of present disclosure are not limited to the details thereof.

Please refer to FIG. 1, which shows a block diagram of a charging load detection system according to the present disclosure. The charging load detection system 100 includes a charger 1 and a charging load detection circuit 2. The charger 1 is coupled to the charging load detection circuit 2, and the charging load detection circuit 2 detects whether a load 3 is coupled to a rear end thereof. The charging load detection circuit 2 includes a charging circuit 20, a frequency generation unit 22, and a control unit 24. The charging circuit 20 provides a charging path 206 having an input terminal 202 and an output terminal 204, and the input terminal 202 is coupled to the charger 1. The frequency generation unit 22 is coupled to the output terminal 204 through the charging path 206, and the control unit 24 is coupled to the charging circuit 20 and the frequency generation unit 22.

Specifically, the control unit 24 controls the frequency generation unit 22 to generate a pulse voltage Vp with a fixed first frequency (for example but not limited to 100 Hz) and a fixed first amplitude (for example but not limited to 16 volts), and the frequency generation unit 22 provides the pulse voltage Vp to the output terminal 204. A current value of a charging current provided from the output terminal 204 is less than 1 milliamp, and therefore an internal controller (not shown) in the charger 1 does not need to add a pin to detect a charging state of the load 3. Accordingly, the charging load detection circuit 2 provides low-current pulse voltage Vp to realize whether the load 3 is coupled or not and types of the load 3. The control unit 24 realizes whether the load 3 is coupled to the output terminal 204 by detecting whether the first frequency and the first amplitude of the pulse voltage Vp are varied or not, thereby controlling connecting or disconnecting the charging path 206 according to whether the load 3 is coupled to the output terminal 204. If the first frequency and the first amplitude of the pulse voltage Vp are not varied, it means that the load 3 is not coupled to the output terminal 204. On the contrary, if the first frequency and the first amplitude of the pulse voltage Vp are varied, it means that the load 3 is coupled to the output terminal 204. At this condition, the control unit 24 determines types of the load 3 according to the voltage waveforms of the output terminal 204 and further controls charging modes of the charging load detection circuit 2 according to types of the load 3.

Figure 2A:
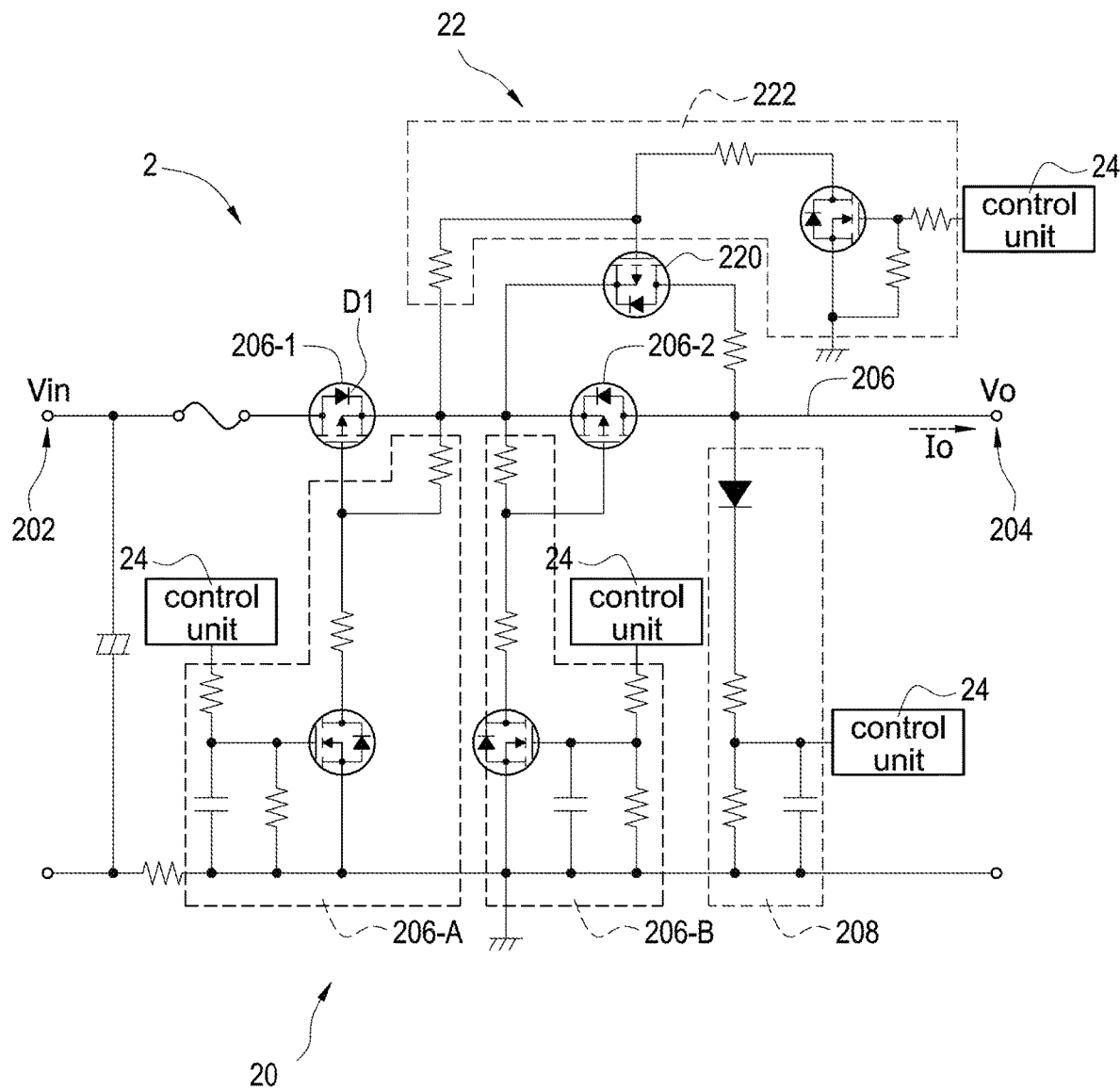
FIG. 2A is a circuit diagram of a charging load detection circuit according to a first embodiment of the present disclosure.

Please refer to FIG. 2A, which shows a circuit diagram of a charging load detection circuit according to a first embodiment of the present disclosure, and also refer to FIG. 1. The charging circuit 20 includes a first switch 206-1 and a second switch 206-2. The first switch 206-1 is coupled to the input terminal 202 and the control unit 24, and the first switch 206-1 is coupled with the charging path 206 in series. The second switch 206-2 is coupled to the first switch 206-1, the control unit 24, and the output terminal 204, and the second switch 206-2 is coupled with the charging path 206 in series. The control unit 24 is coupled to the first switch 206-1 through a first drive unit 206-A and coupled to the second switch 206-2 through a second drive unit 206-B. Specifically, when the control unit 24 wants to control turning on the first switch 206-1, the control unit 24 controls the first drive unit 206-A to make a control end of the first switch 206-1 be not coupled to a ground point so that the first switch 206-1 is turned on. On the contrary, the first switch 206-1 is turned off. In addition, the same operation is true for the second drive unit 206-B. Furthermore, the second switch 206-2 controls the charging path 206 to be shorted-circuited (connected) and disconnected. When the control unit 24 controls the second switch 206-2 to be turned off, the charging path 206 is disconnected so that the charger 1 is not coupled to the load 3. When the control unit 24 controls the second switch 206-2 to be turned on, the charging path 206 is shorted-circuit so that the charger 1 is coupled to the load 3.

The frequency generation unit 22 includes a third switch 220. The third switch 220 is coupled to the control unit 24 and the third switch 220 is coupled to the second switch 206-2 in parallel. The control unit 24 is coupled to the third switch 220 through a third drive unit 222. Specifically, when the control unit 24 wants to control turning on the third switch 220, the control unit 24 control the third drive unit 222 to make a control end of the third switch 220 be not coupled to the ground point so that the third switch 220 is turned on. On the contrary, the third switch 220 is turned off. More specifically, the control unit 24 generates the pulse voltage Vp by switching on or switching off the third switch 220. When the control unit 24 switches on the third switch 220, an input voltage Vin of the input terminal 202 is provided to the output terminal 204 through a path composed of a body diode D1 of the first switch 206-1 and the third switch 220. When the control unit 24 switches off the third switch 220, the input voltage Vin of the input terminal 202 fails to be provided to the output terminal 204 through the path composed of a body diode D1 of the first switch 206-1 and the third switch 220. At this condition, by turning on or turning off the third switch 220, the output terminal 204 outputs the low-current pulse voltage Vp with a fixed first frequency and a fixed first amplitude. Further, when the control unit 24 controls the charging path 206 to be short-circuited, it means that the output terminal 204 is coupled to the load 3. At this condition, the control unit 24 still controls switching on the third switch 220 to continuously detect whether the load 3 is removed.

The charging circuit 20 further includes an output detection circuit 208. The output detection circuit 208 is coupled between the output terminal 204 and the ground point for detecting the variation of an output voltage Vo outputted from the output terminal 204. The control unit 24 realizes the variation of the output voltage Vo through the output detection circuit 208 to control turning on or turning off the first switch 206-1, the second switch 206-2, and the third switch 220.

Figure 2B:
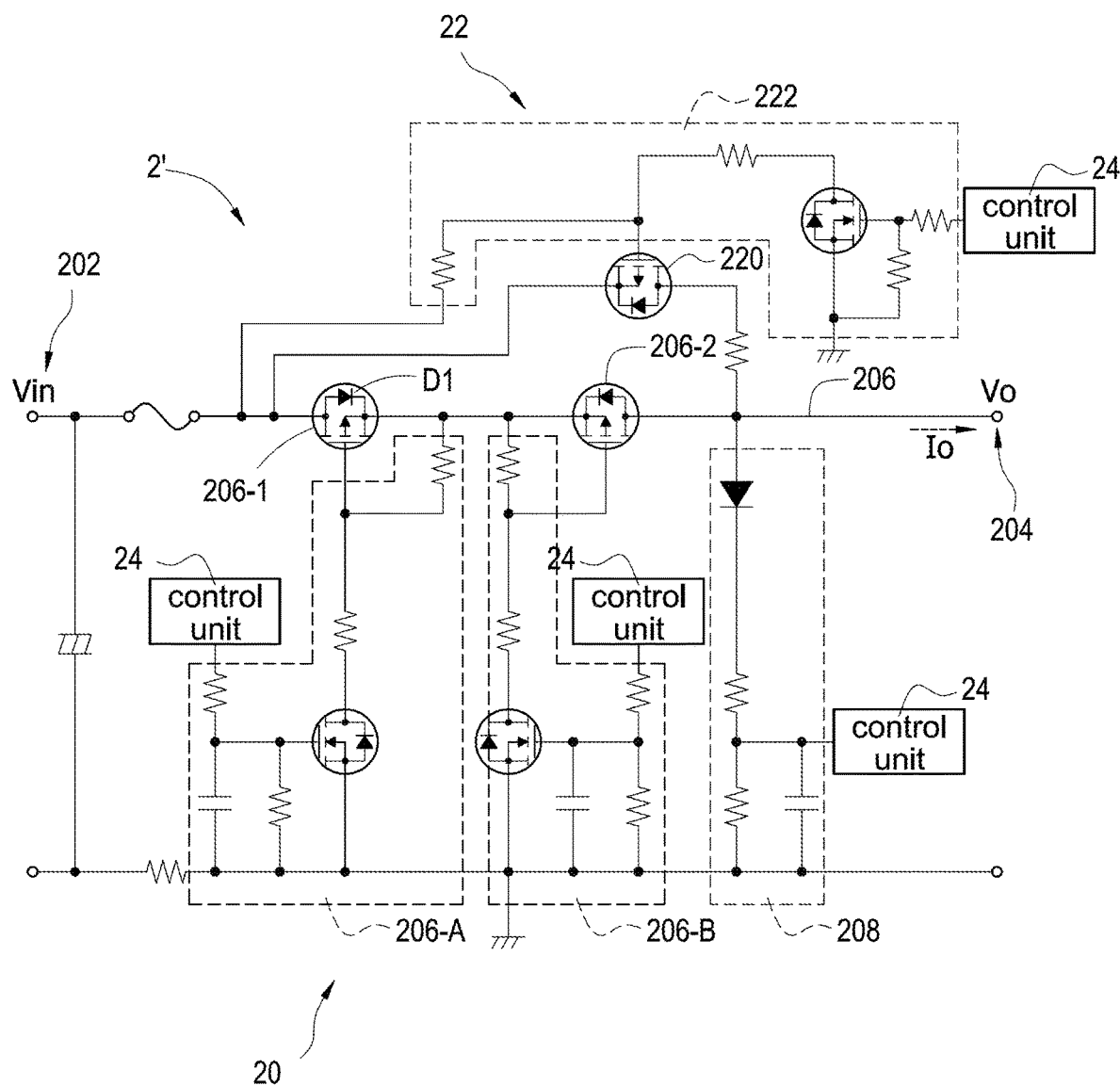
FIG. 2B is a circuit diagram of the charging load detection circuit according to a second embodiment of the present disclosure.

Please refer to FIG. 2B, which shows a circuit diagram of the charging load detection circuit according to a second embodiment of the present disclosure, and also refer to FIG. 1 to FIG. 2A. The difference between the charging load detection circuit 2' shown in FIG. 2B and the charging load detection circuit 2 shown in FIG. 2A is that the connection relationship between the first switch 206-1, the second switch 206-2 and the third switch 220. In the second embodiment shown in FIG. 2B, a first end of the third switch 220 is coupled to a first end of the first switch 206-1, a second end of the third switch 220 is coupled to a first end of the second switch 206-2, and a control end of the third switch 220 is coupled to the first end of the first switch 206-1 so that the input voltage Vin of the input terminal 202 is connected across the first switch 206-1 and the second switch 206-2. When the control unit 24 switches on the third switch 220, the input voltage Vin of the input terminal 202 is provided to the output terminal 204 through a path composed of the third switch 220. When the control unit 24 switches off the third switch 220, the input voltage Vin of the input terminal 202 fails to be provided to the output terminal 204 through the path composed of the third switch 220. At this condition, the low-current pulse voltage Vp with the fixed first frequency and the fixed first amplitude is provided from the output terminal 204 by turning on or turning off the third switch 220. In particular, except that the connection manner of the third switch 220 is different from that of FIG. 2A, other components are coupled and controlled in the same manner as FIG. 2A.

Figure 3A:
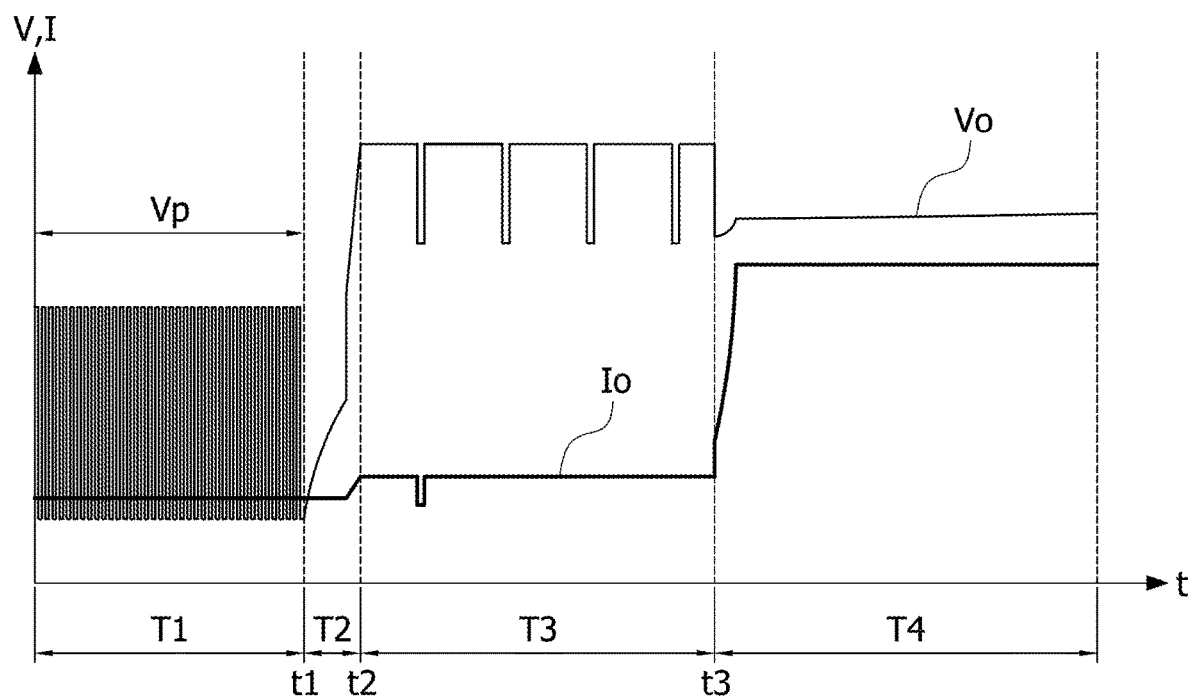
FIG. 3A is an output voltage waveform of the charging load detection circuit coupled with a battery with a sleep mode according to the present disclosure.

Please refer to FIG. 3A, which shows an output voltage waveform of the charging load detection circuit coupled with a battery with a sleep mode according to the present disclosure, and also refer to FIG. 1 to FIG. 2B. During a time interval T1 shown in FIG. 3A, since the load 3 is not yet coupled to the charging load detection circuit 2, the output voltage Vo is the pulse voltage Vp with a fixed first frequency and a fixed first amplitude. In a time point t1, since a battery with a sleep mode, i.e., the load 3 is coupled to the charging load detection circuit 2, the pulse voltage Vp of the output voltage Vo is varied. Specifically, since the battery with the sleep mode needs to be woken up by a trigger voltage, such as a 5-volt voltage, the pulse voltage Vp is provided to the battery with the sleep mode to gradually establish the trigger voltage during the time interval T2. In particular, the battery with the sleep mode usually uses a capacitive component to establish the trigger voltage. Therefore, the voltage value of the output voltage Vo is gradually increased to generate a voltage waveform that increases in capacitive charging curve. The time interval T2 is a first determination time interval for example but not limited to 400 milliseconds that the control unit 24 determines whether the load 3 is coupled to the charging load detection circuit 2 and determines the type of the load 3.

In a time point t2, the control unit 24 determines that the load 3 is the battery with the sleep mode, the control unit 24 notifies the charger 1 so that the charger 1 performs a pre-charging mode to the load 3. At this condition, the control unit 24 controls turning on the first switch 206-1 and the second switch 206-2 so that the charger 1 provides the output voltage Vo (for example but not limited to 29 volts) and the charging current Io (for example but not limited to 1 amp) to the load 3. During a time interval T3, a voltage value of the battery is gradually increased from a low-voltage value (for example but not limited to 19 volts) to a wake-up value (for example but not limited to 23 volts). When the voltage value of the battery is greater than or equal to the wake-up value (in a time point t3), the battery is woken up so that the charger 1 charges the battery in a constant-current mode (CC mode), i.e., the charging current Io is gradually increased to a constant current after the time interval T3.

Figure 3B:
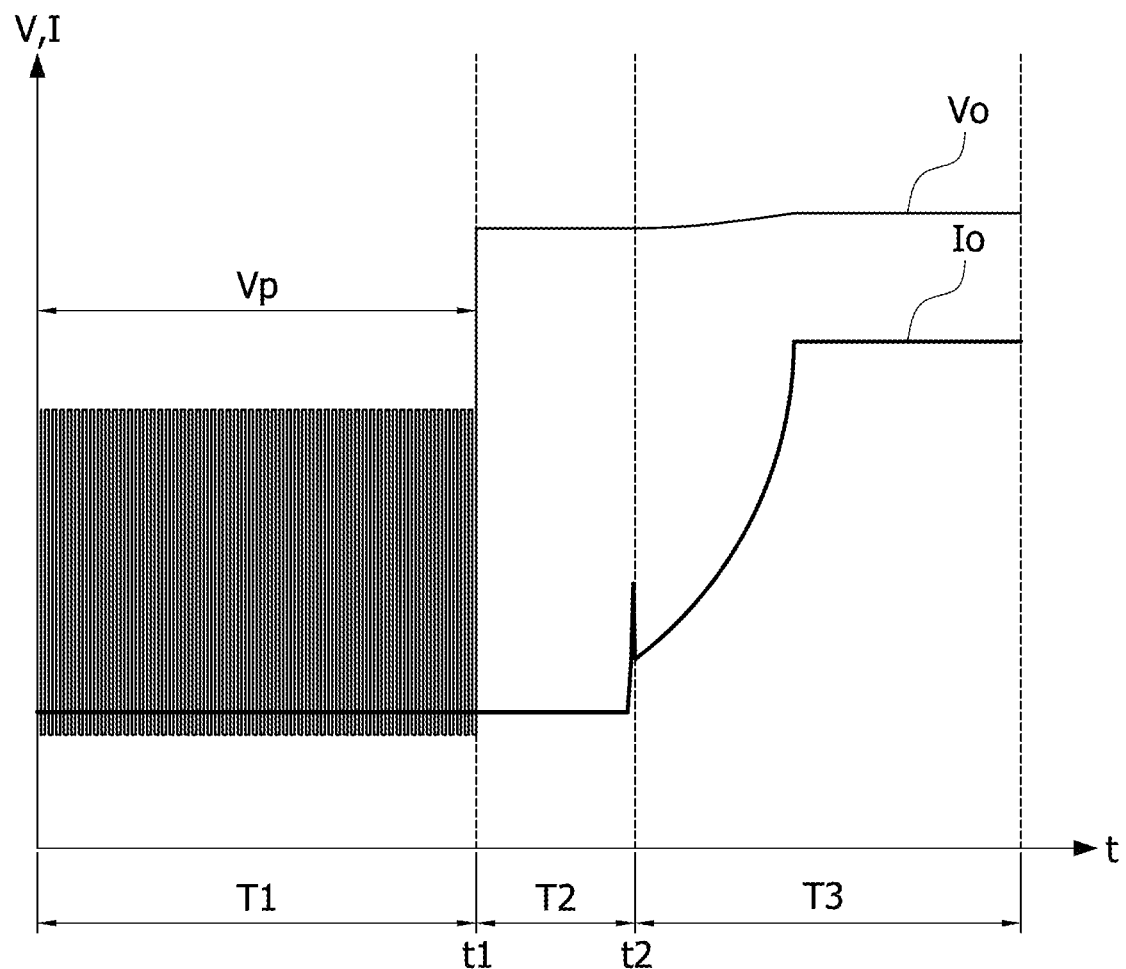
FIG. 3B is an output voltage waveform of the charging load detection circuit coupled with a universal battery according to the present disclosure.

Please refer to FIG. 3B, which shows an output voltage waveform of the charging load detection circuit coupled with a universal battery according to the present disclosure, and also refer to FIG. 1 to FIG. 3A. During the time interval T1 shown in FIG. 3B, since the load 3 is not yet coupled to the charging load detection circuit 2, the output voltage Vo is the pulse voltage Vp with the fixed first frequency and the fixed first amplitude. In a time point t1, since a universal battery, i.e., the load 3 is coupled to the charging load detection circuit 2, the pulse voltage Vp of the output voltage Vo is varied. Specifically, since the universal battery is a battery without a sleep mode, the voltage value of the output voltage Vo is changed from the pulse voltage Vp to the voltage value of the battery, i.e., increased to a fixed value but not up to a full-charging value in the time point t1. The control unit 24 notifies the charger 1 so that the charger 1 charges the load 3 (the universal battery) in the constant-current mode. At this condition, the control unit 24 controls turning on the first switch 206-1 and the second switch 206-2 so that the charger 1 charges the universal battery in the constant-current mode, i.e., the charging current Io is gradually increased to a constant current.

Figure 3C:
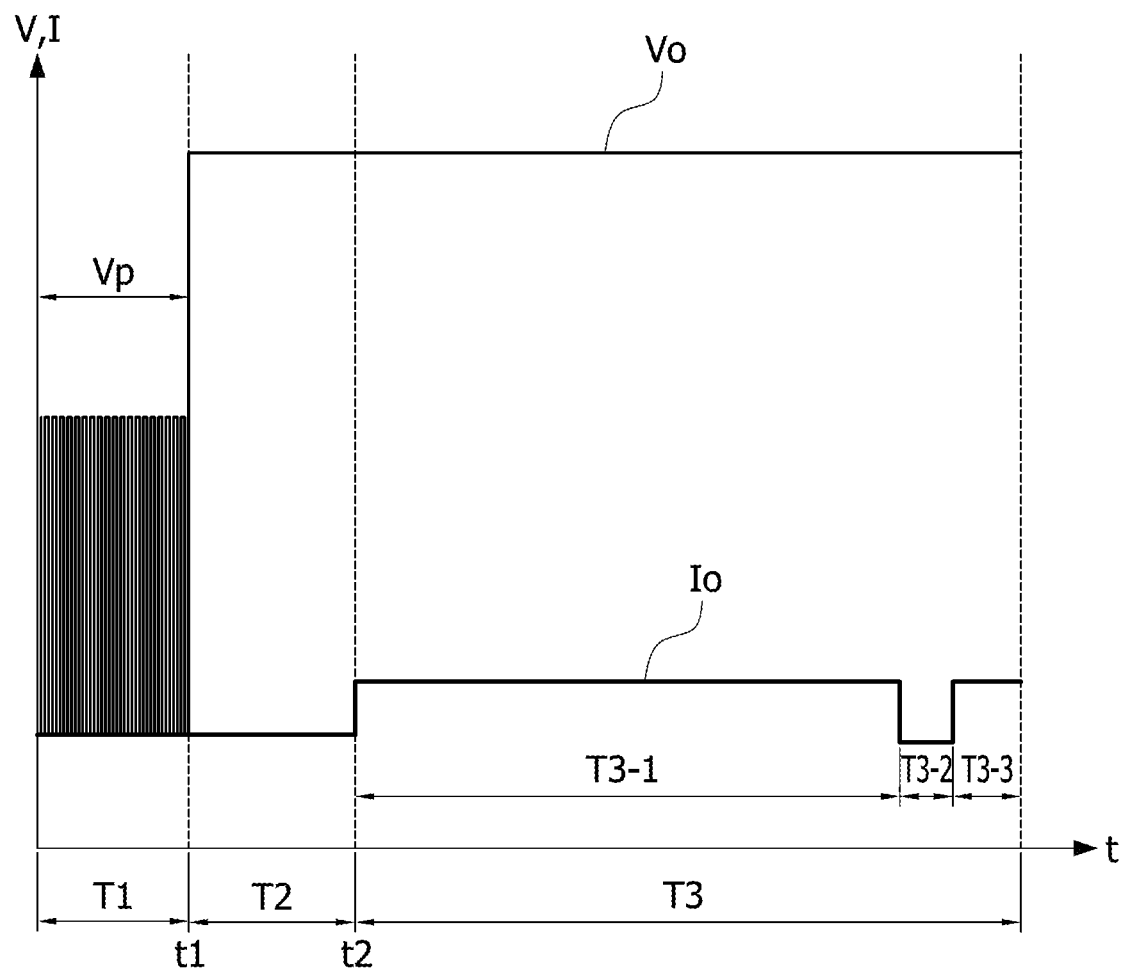
FIG. 3C is an output voltage waveform of the charging load detection circuit coupled with a full-charging battery according to the present disclosure.

Please refer to FIG. 3C, which shows an output voltage waveform of the charging load detection circuit coupled with a full-charging battery according to the present disclosure, and also refer to FIG. 1 and FIG. 3B. During the time interval T1 shown in FIG. 3C, since the load 3 is not yet coupled to the charging load detection circuit 2, the output voltage Vo is the pulse voltage Vp with the fixed first frequency and the fixed first amplitude. In the time point t1, since a full-charging battery, i.e., the load 3 is coupled to the charging load detection circuit 2, the pulse voltage Vp of the output voltage Vo is varied. Specifically, since the full-charging battery is a battery with or without a sleep mode, the voltage value of the output voltage Vo is changed from the pulse voltage Vp to the voltage value of the battery, i.e., increased up to the full-charging value in the time point t1. The control unit 24 acquires the voltage value of the battery that is roughly a full-charging voltage waveform during the first determination time interval of the time interval T2, and determines that the load 3 is a full-charging battery in the time point t2. The control unit 24 notifies the charger 1 so that the charger 1 charges the load 3 (the full-charging battery) in a low-current charging mode, i.e., a current value of the charging current Io is less than or equal to a current threshold value. At this condition, the control unit 24 controls turning on the first switch 206-1 and the second switch 206-2 so that the charger 1 charges the full-charging battery in the low-current charging mode.

Furthermore, during the time interval T3, the charger 1 continuously charges the full-charging battery in the low-current charging mode, for example the charging current is less than or equal to 0.25 amps. Since the first switch 206-1 and the second switch 206-2 are still turned on, the charger 1 still provides the output voltage Vo to the output terminal 204 when the full-charging battery is removed. In order to confirm whether the full-charging battery is removed, the control unit 24 enters a hiccup mode by controlling the first switch 206-1 and the second switch 206-2. During a time interval T3-1, the control unit 24 controls turning on the first switch 206-1 and the second switch 206-2, and during a time interval T3-2, the control unit 24 controls turning off the first switch 206-1 and the second switch 206-2, and therefore to continuously confirm whether the full-charging battery is still coupled to the charging load detection circuit 2. As long as the full-charging battery is still coupled to the charging load detection circuit 2, the voltage value of the output voltage Vo is equal to a voltage value of the full-charging battery so that the voltage value of the output voltage Vo is not varied. At this condition, the control unit 24 determines that the full-charging battery is still coupled to the charging load detection circuit 2. Afterward, when the first switch 206-1 and the second switch 206-2 are from turning off to turning on, the charging current Io returns to the current value in the low-current charging mode shown in the time interval T3-3.

Figure 3D:
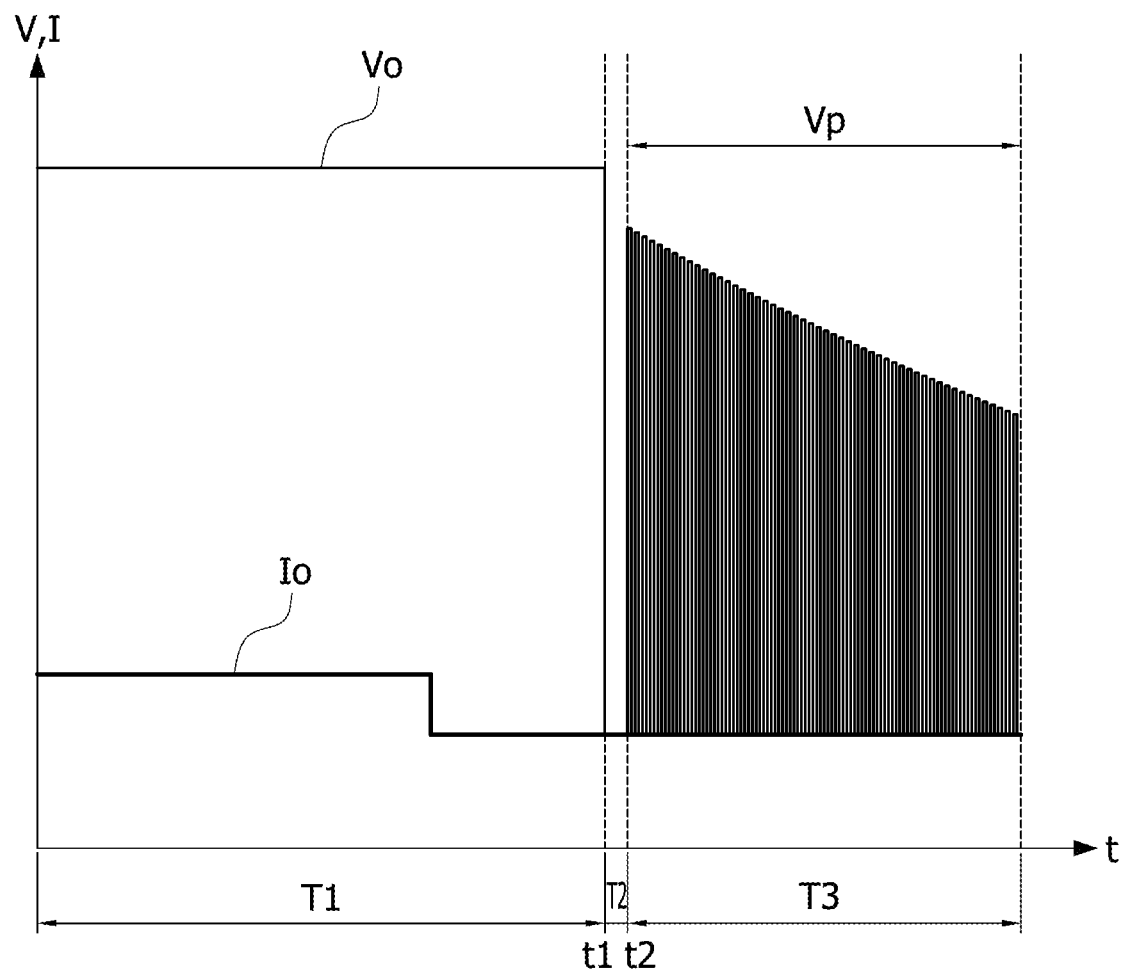
FIG. 3D is an output voltage waveform of the charging load detection circuit removed from the full-charging battery according to the present disclosure.

Please refer to FIG. 3D, which shows an output voltage waveform of the charging load detection circuit removed from the full-charging battery according to the present disclosure, and also refer to FIG. 1 to FIG. 3C. In the hiccup mode (during the time interval T1), when the first switch 206-1 and the second switch 206-2 are from turning off to turning on but the voltage value of the output voltage Vo is reduced to zero volt (in the time point t1) from the current voltage value, the control unit 24 realizes that the full-charging battery may have been removed. At this condition, since the control unit 24 has to confirm whether the load 3 is removed, the control unit 24 realizes that voltage value of the output terminal 204 is continuously less than or equal to a voltage threshold value during a second determination time interval of the time interval T2, for example but not limited to 100 milliseconds. In a time point t2, since the control unit 24 determines that the full-charging battery is removed, the control unit 24 controls turning off the first switch 206-1 and the second switch 206-2, and controls switching on the third switch 220 so that the frequency generation unit 22 provides the pulse voltage Vp to the output terminal 204 after a time interval T3.

In particular, in one embodiment of the present disclosure, when a non-full-charging battery, which is a battery with or without a sleep mode, is removed, a charging current Io that is charging the non-full-charging battery quickly reduces to zero. The control unit 24 acquires a current waveform in which the charging current Io quickly reduces to zero during the second determination time interval of the time interval T2, for example but not limited to 100 milliseconds. In a time point t2, since the control unit 24 determines that the non-full-charging battery is removed, the control unit 24 controls turning off the first switch 206-1 and the second switch 206-2, and controls switching on the third switch 220 so that the frequency generation unit 22 provides the pulse voltage Vp to the output terminal 204 after a time interval T3.

Figure 4A:
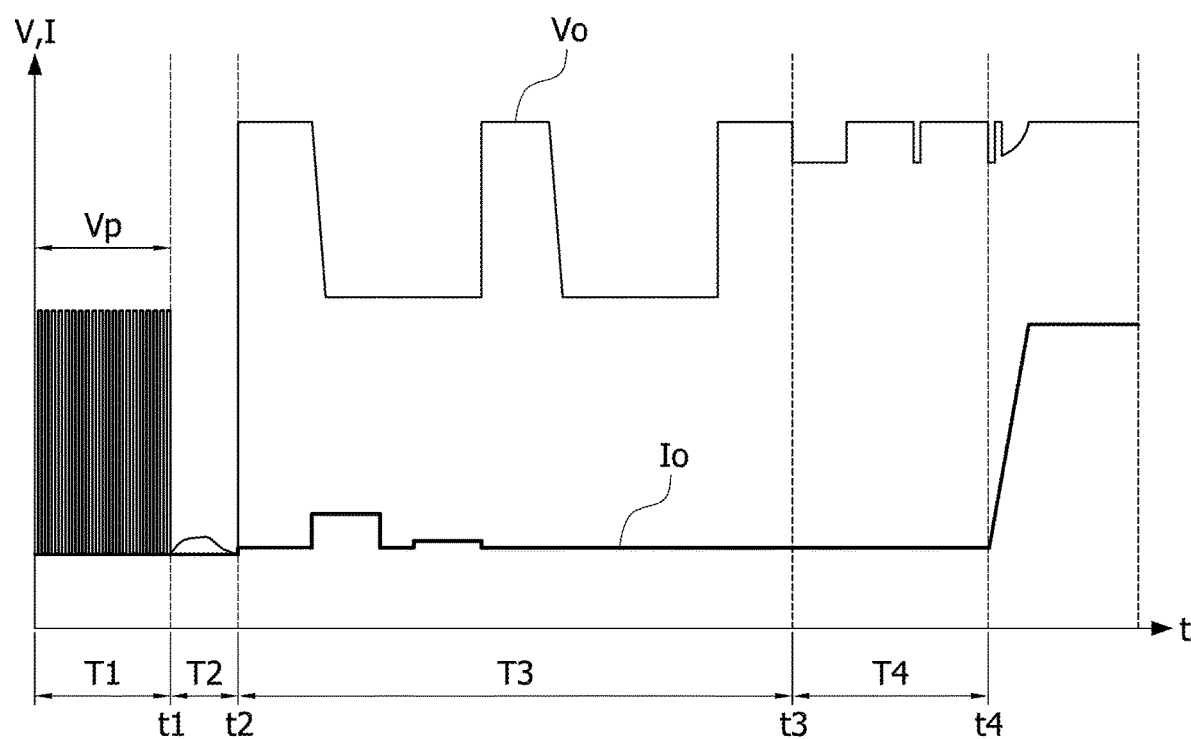
FIG. 4A is an output voltage waveform of the charging load detection circuit coupled with a charging station according to the present disclosure.

Please refer to FIG. 4A, which shows an output voltage waveform of the charging load detection circuit coupled with a charging station according to the present disclosure, and also refer to FIG. 1 to FIG. 3D. During a time interval T1 shown in FIG. 4A, since the load 3 is not yet coupled to the charging load detection circuit 2, the output voltage Vo is the pulse voltage Vp with the fixed first frequency and the fixed first amplitude. In a time point t1, since a charging station, i.e., the load 3 is coupled to the charging load detection circuit 2, the pulse voltage Vp of the output voltage Vo is varied. Since the input terminal of the charging station mostly has capacitive or resistive components, the output voltage Vo produces a voltage waveform with low-voltage fluctuations during the time interval T2. The control unit 24 acquires a voltage waveform with low-voltage fluctuations during the first determination time interval of the interval T2, and determines that the load 3 is a charging station in time point t2.

In a time point t2, the control unit 24 determines that the load 3 is the charging station. The control unit 24 notifies the charger 1 so that the charger 1 performs a POD mode to the load 3 (the charging station). At this condition, the control unit 24 controls turning on the second switch 206-2, and controls switching on or off the first switch 206-1. During a time interval T3, the charger 1 provides the output voltage Vo to the charging station. At this condition, when the first switch 206-1 is switched on, the input voltage Vin provided by the charger 1 can be transmitted to the charging station through the first switch 206-1 so that the voltage value of the output voltage Vo is a high-level voltage value (for example but not limited to 29 volts). When the first switch 206-1 is switched off, the input voltage Vin provided by the charger 1 can be transmitted to the charging station through only a body diode D1 of the first switch 206-1 so that the voltage value of the output voltage Vo is a low-level voltage (for example but not limited to 16 volts). By switching on or off the first switch 206-1, the output voltage Vo has a voltage waveform with a second frequency and a second amplitude so that the control unit 24 can realize whether the battery is connected to the charging station or not according to the variation of the second amplitude of the voltage waveform. In particular, if no battery is connected to the charging station, the charging station operates in a light-loading condition and the charging current Io is lower, for example but not limited to 1 to 2 milliamps.

Specifically, since the charging station has the lowest operation power, the charging station will stop working if the voltage value of the output voltage Vo provided from the output terminal 204 is less than the lowest operation power. Therefore, the voltage value of the output voltage Vo provided from the output terminal 204 must be higher than the lowest operation power, such as the above-mentioned 16 volts. However, since the charging station does not contain the battery, a condition of reversing power may occur if the voltage value of the battery, which is connected to the charging station, exceeds the lowest operation power. Therefore, when the first switch 206-1 is switched off, the reverse bias of the body diode D1 prevents the voltage value of the battery from exceeding the lowest operation power to avoid the reversing power.

Refer to FIG. 4A again, in the time point t3, the battery is connected to the charging station. At this condition, the low-level voltage will be pulled to the current voltage value of the battery, thereby changing the second amplitude of the voltage waveform. The control unit 24 acquires the voltage waveform of the changed second amplitude during a third determination time interval of a time interval T4, for example but not limited to 200 milliseconds, and determines that the battery is connected to the charging station in a time point t4. At this condition, the control unit 24 controls turning on the first switch 206-1 so that the charger 1 starts providing the charging current Io to charge the battery.

Figure 4B:
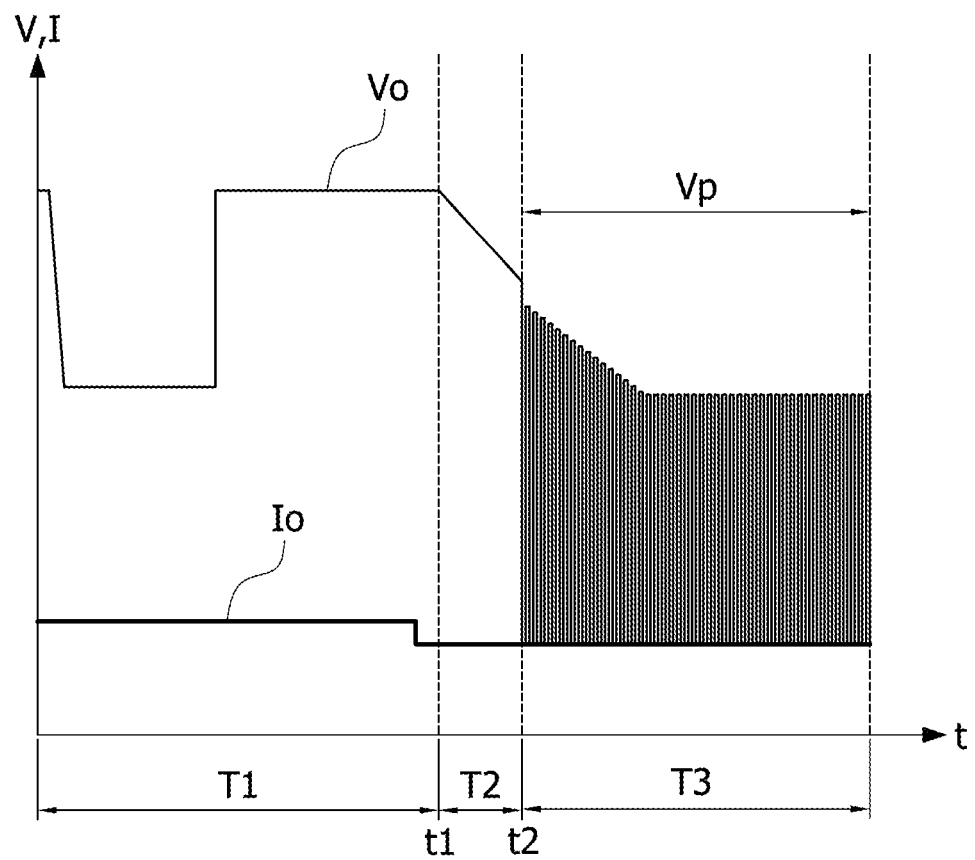
FIG. 4B is an output voltage waveform of the charging load detection circuit removed from the charging station according to the present disclosure.

Please refer to FIG. 4B, which show an output voltage waveform of the charging load detection circuit removed from the charging station according to the present disclosure, and also refer to FIG. 1 to FIG. 4A. During the time interval T1, the output voltage Vo has a voltage waveform with the fixed second frequency and the fixed second amplitude, it means that the charging station is still coupled to the charging load detection circuit 2. In the time point t1, the charging station is removed but since the voltage value of the output voltage Vo has not changed, the control unit 24 does not detect that the charging station has been removed. During the time interval T2, the charging station is removed, and the control unit 24 controls turning off the first switch 206-1 as a result of the fact that the energy stored in the output voltage Vo at the high-level voltage value cannot be effectively consumed. At this condition, a falling-edge time of the falling edge of the voltage waveform is longer and a slope thereof is flatter. Therefore, it is possible to determine whether the charging station is removed by using at least two kinds of methods as follows.

One of the determination methods is: in the time point t2, the control unit 24 detects that a falling-edge voltage of the voltage waveform during a threshold time interval is not below a threshold voltage, in which the threshold time interval is the second determination time interval for example but limited to 100 milliseconds. The threshold voltage can be set to the voltage value of the low-level voltage (16 volts). If the falling-edge voltage of the voltage waveform is not reduced from the high-level voltage to the low-level voltage (16 volts) during the second determination time interval, it means that that charging station has been removed. At this condition, the control unit 24 controls turning off the first switch 206-1 and the second switch 206-2, and controls switching on the third switch 220 so that the frequency generation unit 22 provides the pulse voltage Vp to the output terminal 204 after the time interval T3.

The other of the determination methods is: in the time point t2, the control unit 24 detects that a falling-edge time interval that the falling-edge voltage of the voltage waveform drops to the low-level voltage is greater than the threshold time interval, in which the threshold time interval is the second determination time interval for example but limited to 100 milliseconds. The falling-edge time interval is a time interval that the high-level voltage drops to the low-level voltage. At this condition, the control unit 24 controls turning off the first switch 206-1 and the second switch 206-2, and controls switching on the third switch 220 so that the frequency generation unit 22 provides the pulse voltage Vp to the output terminal 204 after the time interval T3.

In particular, when the battery is coupled to the charger 1 but the charger 1 is removed from the charging load detection circuit 2, the charging current Io that is charging the battery will quickly drop to zero. The control unit 24 acquires a current waveform in which the charging current Io quickly reduces to zero during the second determination time interval of the interval T2, for example but not limited to 100 milliseconds. In the time point t2, since the control unit 24 determines that the non-full-charging battery is removed, the control unit 24 controls turning off the first switch 206-1 and the second switch 206-2, and controls switching on the third switch 220 so that the frequency generation unit 22 provides the pulse voltage Vp to the output terminal 204 after the time interval T3.

In particular, in one embodiment of the present disclosure, the number of seconds of the determination time interval described in FIG. 3A to FIG. 4B can be adjusted according to the actual needs of the circuit application. In addition, in one embodiment of the present disclosure, the first frequency and the first amplitude of the pulse voltage can also be adjusted according to the actual needs of the circuit application.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. A charging load detection circuit, comprising:
    a charging circuit configured to provide a charging path having an input terminal and an output terminal, and the input terminal coupled to a charger,
    a frequency generation unit coupled to the output terminal through the charging path, and
    a control unit coupled to the charging circuit and the frequency generation unit,
    wherein the control unit is configured to control the frequency generation unit to generate a pulse voltage with a fixed first frequency and a fixed first amplitude, and the frequency generation unit is configured to provide the pulse voltage to the output terminal; the control unit is configured to realize whether a load is coupled to the output terminal by detecting whether the first frequency and the first amplitude are varied, and configured to control connecting or disconnecting the charging path according to whether the load is coupled to the output terminal.

2. The charging load detection circuit in claim 1, wherein the charging circuit comprises:
    a first switch coupled to the input terminal and the control unit, and coupled with the charging path in series, and
    a second switch coupled to the first switch, the control unit, and the output terminal, and coupled with the charging path in series,
    wherein when the second switch is controlled by the control unit to be turned off, the charging path is disconnected, and when the second switch is controlled to be turned on, the charging path is short-circuited.

3. The charging load detection circuit in claim 2, wherein when the control unit is configured to detect that the pulse voltage is changed from a voltage waveform with the fixed first frequency and the fixed first amplitude to a voltage waveform that increases in capacitive charging curve, the control unit realizes that load is a battery with a sleep mode and controls turning on the first switch and the second switch.

4. The charging load detection circuit in claim 2, wherein when the control unit is configured to detect that the pulse voltage is changed from a voltage waveform with the fixed first frequency and the fixed first amplitude to a voltage waveform with a fixed value, the control unit realizes that load is a universal battery and controls turning on the first switch and the second switch.

5. The charging load detection circuit in claim 2, wherein when the first switch and the second switch are turned on and a current flowing through the output terminal is less than or equal to a current threshold value, the control unit is configured to control the first switch and the second switch entering a hiccup mode.

6. The charging load detection circuit in claim 5, wherein in the hiccup mode, when the first switch and the second switch are from turning off to turning on, and a voltage value of the output terminal is less than or equal to a voltage threshold value and the current value is less than or equal to the current threshold value, the control unit is configured to continuously control turning off the first switch and the second switch and control the frequency generation unit providing the pulse voltage to the output terminal.

7. The charging load detection circuit in claim 2, wherein when the control unit is configured to detect that the pulse voltage is changed from a voltage waveform with the fixed first frequency and the fixed first amplitude to a voltage waveform with low-voltage fluctuations, the control unit realizes that load is a charging station, and controls turning on the second switch and switching on or off the first switch so that the voltage waveform is a waveform with a fixed second frequency and a fixed second amplitude.

8. The charging load detection circuit in claim 7, wherein when the control unit is configured to switch off the first switch, an input voltage of the input terminal is provided to the output terminal through a body diode of the first switch.

9. The charging load detection circuit in claim 7, wherein when the control unit is configured to detect that the second amplitude is varied, the control unit controls turning on the first switch.

10. The charging load detection circuit in claim 7, wherein control unit is configured to detect that a falling-edge voltage of the voltage waveform during a threshold time interval is not below a threshold voltage, the control unit is configured to control turning off the first switch and the second switch and control the frequency generation unit providing the pulse voltage to the output terminal.

11. The charging load detection circuit in claim 7, wherein control unit is configured to detect that a falling-edge time interval of the voltage waveform is greater than a threshold time interval, the control unit is configured to control turning off the first switch and the second switch and control the frequency generation unit providing the pulse voltage to the output terminal.

12. The charging load detection circuit in claim 2, wherein the frequency generation unit comprises:
    a third switch coupled to the control unit and coupled to the second switch in parallel,
    wherein the control unit is configured to switch on or off the third switch so that an input voltage of the input terminal pass through a body diode of the first switch, and generates the pulse voltage by switching on or off the third switch.

13. The charging load detection circuit in claim 12, wherein when the control unit is configured to control the charging path to be short-circuited, the control unit controls switching on the third switch.

14. The charging load detection circuit in claim 2, wherein the frequency generation unit comprises:
    a third switch coupled to the control unit and coupled to the first switch and the second switch in parallel,
    wherein the control unit is configured to switch on or off the third switch so that an input voltage of the input terminal is connected across the first switch and the second switch, and generates the pulse voltage by switching on or off the third switch.

* * * * *